United States Patent [19]

Kuroiwa

[11] Patent Number: 5,210,538
[45] Date of Patent: May 11, 1993

[54] GLITCH DETECTION CIRCUIT AND METHOD

[75] Inventor: Masahiko Kuroiwa, Kawasaki, Japan

[73] Assignee: Kikusui Electronics Corporation, Kanagawa, Japan

[21] Appl. No.: 758,617

[22] Filed: Sep. 12, 1991

[30] Foreign Application Priority Data

Sep. 26, 1990 [JP] Japan .................................. 2-257869

[51] Int. Cl.$^5$ .............................................. H03M 1/34
[52] U.S. Cl. ...................................... 341/160; 341/132
[58] Field of Search ........................ 341/132, 155, 160

[56] References Cited

U.S. PATENT DOCUMENTS

| | | | |
|---|---|---|---|
| 3,882,489 | 5/1975 | Guggolz | 341/132 |
| 4,211,999 | 7/1980 | Clark et al. | 341/160 |
| 4,271,486 | 6/1981 | Dagostino et al. | |
| 4,611,194 | 9/1986 | Konig et al. | 341/122 |
| 4,908,622 | 3/1990 | Turai | 341/122 |

FOREIGN PATENT DOCUMENTS

58-94198 6/1983 Japan .

Primary Examiner—Marc S. Hoff
Attorney, Agent, or Firm—Finnegan, Henderson, Farabow, Garrett and Dunner

[57] ABSTRACT

A glitch detection circuit having an A/D converter, a state holding circuit, a discrimination circuit and a storing circuit. The A/D converter samples an input signal at a predetermined sampling interval to produce digital data during a predetermined acquisition interval which is longer or equal to the sampling interval. The state holding circuit is connected to an output terminal of the A/D converter, and holds a distribution state of the digital data in the predetermined acquisition interval. The discrimination circuit detects a maximum value and a minimum value during the acquisition interval based on the digital data held in the state holding circuit, and the storing circuit stores the maximum value and the minimum value produced from the discrimination circuit for each acquisition interval. The arrangement can obviate the need for the feedback loop that limits the operation speed in a conventional circuit, and can detect maximum values and the minimum values by using the state holding circuit and discriminating circuit arranged in cascade. The circuit can approximately double the operation speed of a conventional circuit, and hence can double the sampling frequency of the analog-to-digital converter. A glitch of a half pulse width can be detected.

8 Claims, 12 Drawing Sheets

GLITCH DETECTION CIRCUIT AND METHOD

BACKGROUND OF THE INVENTION

1. FIELD OF THE INVENTION

The present invention relates to a glitch detection circuit and method for detecting a glitch included in an input signal to an oscilloscope or the like.

2. DESCRIPTION OF THE PRIOR ART

A glitch refers to a perturbation of the pulse waveform of relative short duration and of uncertain origin, which unexpectedly occurs during an acquisition interval. Here, the acquisition interval, which is longer than or equal to a sampling interval, refers to an interval between the two adjacent acquisition points at which sampled values of the input signal are acquired for recording.

In general, a conventional glitch detection circuit cannot convert a glitch occurring during the acquisition interval from an analog signal to a digital signal as long as the glitch occurs and disappears within the acquisition interval, and hence such a glitch cannot be detected by the conventional glitch detection circuit.

Such a glitch is a noise consisting of components above the Nyquist frequency, according to the quantization theory, and can be suitably eliminated by a filter in normal cases. However, it is often necessary to detect the presence and magnitude of such a glitch occurring during the acquisition interval in order to distinguish an accidental abnormality from a normal steady phenomenon.

To accomplish this, maximum and minimum amplitudes of a signal waveform inputted during the acquisition interval must be detected and recorded. U.S. Pat. No. 4,271,486 (Dagostino, et al., "Waveform storage system", Tektronix, Inc., Published Jun. 2, 1981) teaches an example to achieve such operation as follows: first, it converts an input signal from an analog signal to a digital signal by using an analog-to-digital circuit at a sampling rate higher than the acquisition rate at which the input signal is measured; second, it detects the maximum and minimum values of the digital data produced from the analog-to-digital circuit during each acquisition interval; and finally it stores the maximum and minimum values in a memory so as to detect a glitch.

Figure 1:
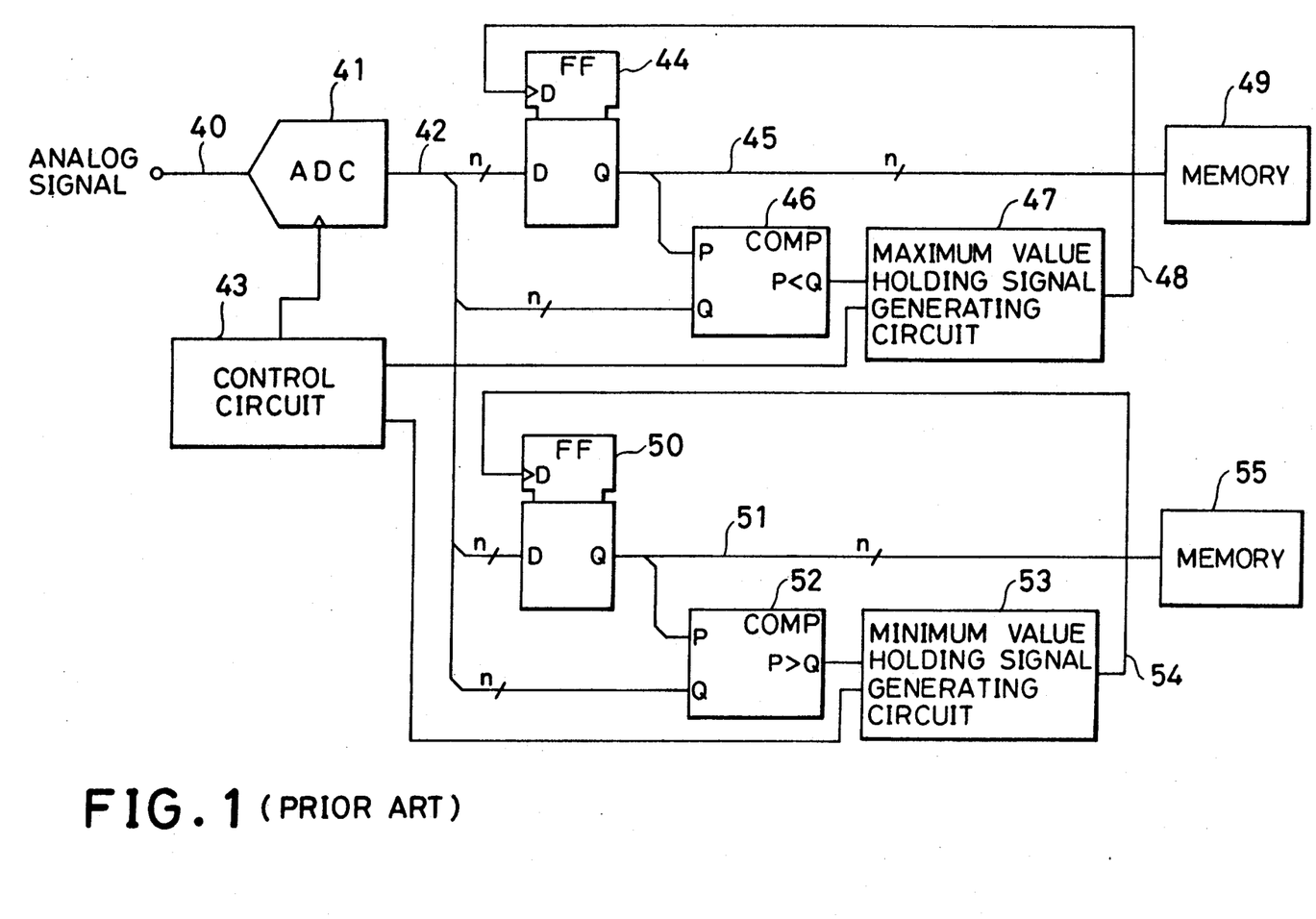
FIG. 1 is a block diagram showing a schematic arrangement of a conventional glitch detection circuit.

FIG. 1 is a block diagram showing a conventional circuit used for detecting the maximum and minimum values to detect a glitch. The operation of this circuit will be described.

An analog-to-digital converter 41 carries out an A/D conversion at a sampling interval shorter than an acquisition interval which is determined in accordance with a time axis range of a measurement. Recording of the acquired data to memories 49 and 55 is performed at the acquisition interval which is assumed to be m times the length of the sampling interval of the analog-to-digital converter 41. In other words, the maximum and minimum values among every m pieces of digital data are recorded to the memories 49 and 55.

The digital data produced from the analog-to-digital converter 41 are transferred to maximum value holding flip-flops 44, a maximum value comparing circuit 46, minimum value holding flip-flips 50 and a minimum value comparing circuit 52.

Detection of the maximum value is carried out as follows. First, the maximum value holding flip-flops 44 hold first digital data. Second, the maximum value comparing circuit 46 compares a second data newly produced from the analog-to-digital converter 41 with the first data held in the maximum value holding flip-flops 44, and waits for the next (third) data performing nothing when the second data is less than the first data held in the maximum value holding flip-flops 44. In contrast, when the second data is greater than the first data held in the flip-flops 44, the maximum value comparing circuit 46 applies a signal to a maximum value holding signal generating circuit 47, which generates a holding signal 48. The maximum value holding flip-flops 44 read the second digital data and hold it in response to the holding signal 48, and wait for the next (third) digital data.

When the third digital data is produced from the analog-to-digital converter 41, the foregoing cycle is repeated until m pieces of digital data are processed, that is, until one acquisition interval is completed.

When the cycle with regard to the latest digital data of the acquisition interval is completed, the data held in the maximum value holding flip-flops 44 is the maximum value among the m pieces of data, and this data is recorded in the acquisition memory 49 as a maximum value. Upon completion of the processing of m pieces of the data, the maximum value holding signal generating circuit 47 produces the holding signal 48 to hold the next digital data from the analog-to-digital converter 41, i.e., the first data of the next m pieces of data from the analog-to-digital converter 41, and repeats the above processing.

Similar cycles are carried out to detect minimum values. The minimum value comparing circuit 52 compares the preceding minimum value held in the minimum value holding flip-flops 50 with new digital data produced from the analog-to-digital circuit 41. The data greater than the preceding minimum value is ignored, whereas the data less than the preceding minimum value is read into the minimum value holding flip-flips 50 as a new minimum value. Upon processing m pieces of data, the minimum value among the m pieces of data is recorded in an acquisition memory 55 as in the processing of maximum values. After that, the first data of the next m pieces of data is held, thus repeating the foregoing cycle.

The above-described conventional glitch detection circuit detects a glitch by judging the maximum and minimum values among the digital data obtained over the acquisition interval determined in accordance with a time axis range selected, and by recording the maximum and minimum values.

The conventional circuit, however, includes a feedback loop consisting of the comparing circuit, holding signal generating circuit and maximum or minimum value holding flip-flops because the conventional technique holds, in the process of detecting the maximum and minimum values, these maximum and minimum values based on the compared result between the preceding maximum or minimum value and the new data supplied from the analog-to-digital converter 41. As a result, the total sum of transfer delay times of these circuits determines the signal processing time, which hinders signal processing at a high sampling rate.

Figure 2:
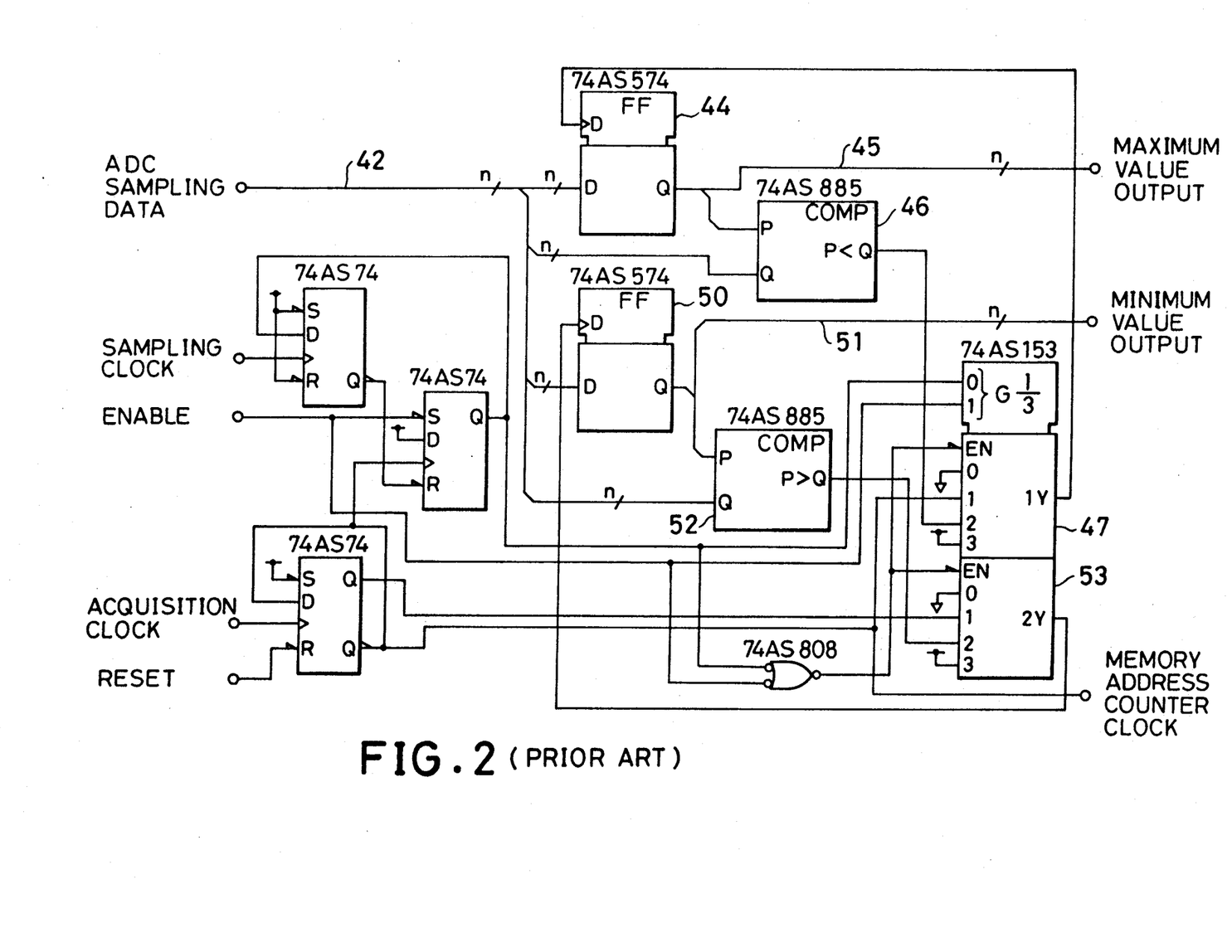
FIG. 2 is a block diagram showing the detail of maximum and minimum value detection portions of the conventional glitch detection circuit.

For example, the maximum operation speed of the conventional circuit can be evaluated in terms of the sampling frequency with regard to the conventional circuit arranged as shown in FIG. 2 by using high speed logic elements whose speed is approximately equal to that of AS-TTL (Advanced Schottky Transistor-Transistor Logic) elements.

Let us assume that the conventional circuit is composed of the following elements: the maximum value holding flip-flops 44 and the minimum value holding flip-flops 50 are 74AS574, the maximum value comparing circuit 46 and the minimum value comparing circuit 52 are 74AS885, and the holding signal generating circuits 47 and 53 are 74AS153. In this case, the delay time of each element is as follows: the time required to produce a result by comparing the new digital data with the preceding data, that is, the delay of 74AS885 is 5.5 nanoseconds; the time required to generate the holding signal in response to the output of the comparing circuit, that is, the delay of 74AS153 is 5 nanoseconds; and the time required from the production of the holding pulse to the establishment of the new data, that is, the delay time of 74AS574 is 6 nanoseconds (the sum total so far is 16.5 nanoseconds). In addition, when latch circuits of 74AS574 (not shown in FIG. 2) are used to load the maximum and minimum data into the memories 49 and 52, another 2 nanoseconds are required, thereby resulting in the total transfer delay time of 18.5 nanoseconds when AS-TTLs are used to arrange the circuit. In other words, the upper limit of the sampling frequency of the analog-to-digital converter becomes about 54 MHz. Taking into account the margin for positive operation, the upper limit of the sampling frequency must be further reduced.

In order to operate the conventional circuit at a higher sampling frequency, higher speed logic elements are required. For example, to operate it reliably at a 100 MHz sampling frequency, the circuit must be composed of logic elements having a speed of 100K series ECL logic elements.

However, logic circuits whose clock speed is on the order to 100 MHz are commonly composed of TTL logic elements. In such a case, mixing the ECL logic elements with the TTL logic elements presents disadvantages in terms of cost, power consumption, and packaging area. For this reason, even in a waveform storage device including an analog-to-digital converter with a high sampling frequency, the sampling frequency must sometimes be reduced when the glitch detection function is in operation.

SUMMARY OF THE INVENTION

It is therefore an object of the present invention to provide a glitch detection circuit and method that makes it possible to detect a glitch narrower in width than that of the conventional device can detect.

In the first aspect of the present invention, a glitch detection circuit comprises:

A/D converting means for sampling an input signal at a predetermined sampling intervals during to produce digital data in a predetermined acquisition interval which is longer than or equal to the sampling interval, state holding means connected to output terminals of the A/D converting means for holding a distribution state of the digital data in the predetermined acquisition interval, discrimination means for detecting a maximum value and a minimum value in the acquisition interval based on the digital data held in the state holding means, and storing means for storing the maximum value and the minimum value produced from the discrimination means for each acquisition interval.

Here, the state holding means may comprise:

decode means for decoding a logic state of n-bit digital data fed from the A/D converting means, thereby selecting one of its $2^n$ output lines corresponding to one of $2^n$ logic states made by the n-bit digital data to represent the logic state of the n-bit digital data; and binary value storing means, each of which is connected to one of the $2^n$ output lines of the decode means, for storing the logic state outputted from the decode means.

The discrimination means may comprise a first priority encoder connected to $2^n$ output lines of the binary value storing means to produce a maximum value of the n-bit digital data, and a second priority encoder connected to $2^n$ output lines of the binary value storing means to produce a minimum value of the n-bit digital data.

The binary value storing means may consist of JK flip-flops.

The binary value storing means may consist of D-type flip-flops.

In the second aspect of the present invention, glitch detection method comprises the steps of:

(a) converting an input signal into successive n-bit digital data by sampling the input signal at a predetermined sampling interval in a predetermined acquisition interval which is longer than or equal to the sampling interval;

(b) holding a distribution state of first n-bit digital data in the acquisition interval by decoding the first n-bit digital data into $2^n$-bit data and holding the $2^n$-bit data;

(c) changing the distribution state by decoding the next n-bit digital data of the acquistion interval by decoding the next n-bit digital data into $2^2$-bit data, comparing the $2^n$-bit data with the preceding distribution data, and by updating one or more bits of the $2^n$-bit data different from the preceding distribution data;

(d) repeating the step (c) with the succeeding n-bit digital data of the acquisition interval;

(e) detecting, on completing the steps (a)–(d), a maximum value and a minimum value in the acquisition interval; and (f) storing the maximum value and the minimum value of the n-bit digital data for the acquisition interval.

The arrangement of the present invention can obviate the feedback loop that limits the operation speed of the conventional circuit, and can detect maximum values and the minimum values by using the state holding means and the discriminating means arranged in cascade. As a result, the circuit of the present invention can double the operation speed of a conventional circuit, and hence can double the sampling frequency of the analog-to-digital converter. Consequently, a glitch of a half width can be detected.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 3:
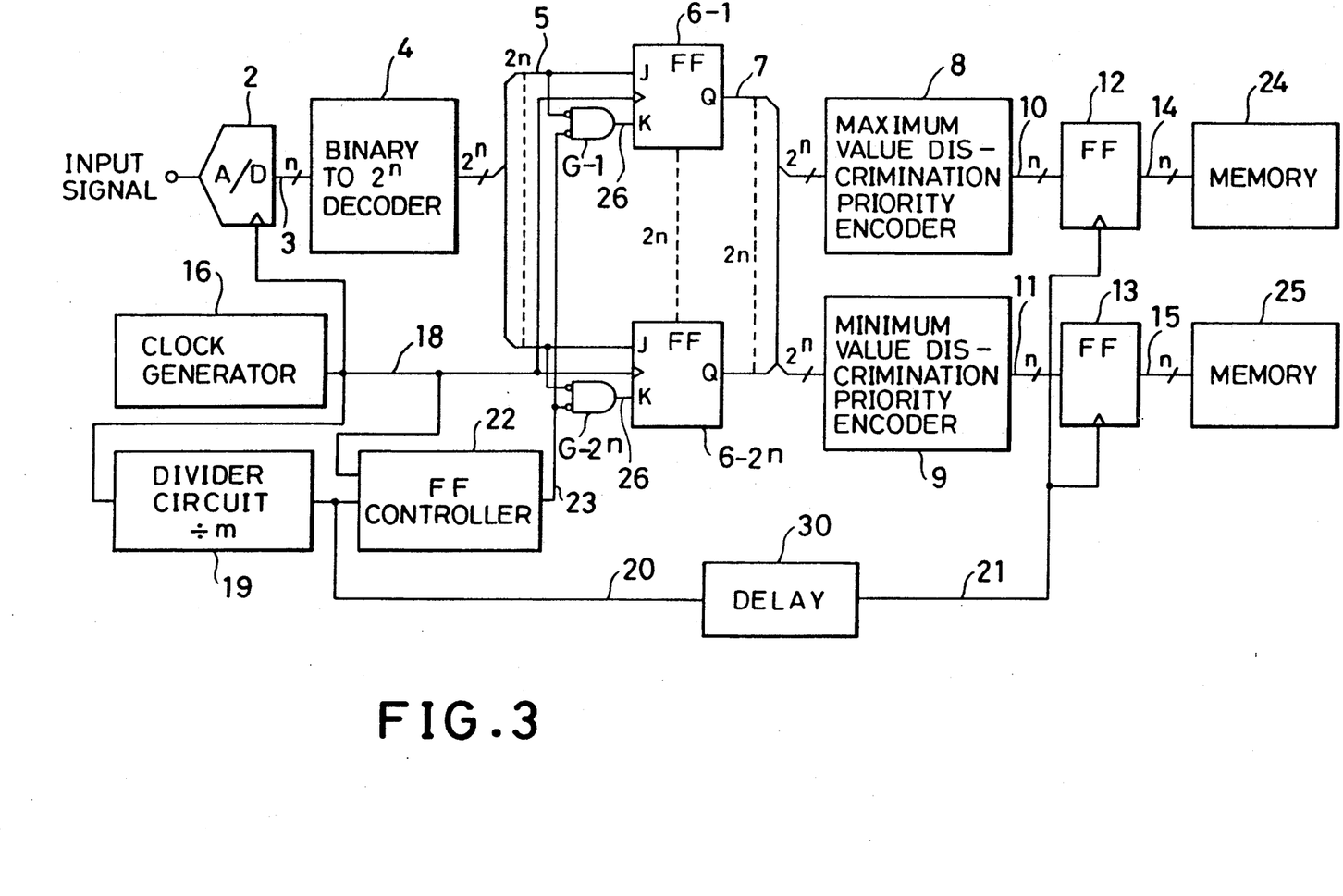
FIG. 3 is a block diagram showing an arrangement of a first embodiment of a glitch detection circuit according to the present invention.

FIG. 3 is a block diagram showing a first embodiment of a glitch detection circuit according to the present invention. In this embodiment, an analog-to-digital converter 2 has a resolution of n bits, and a maximum value and a minimum value are detected in every m pieces of digital data included in each acquisition interval.

Figure 4:
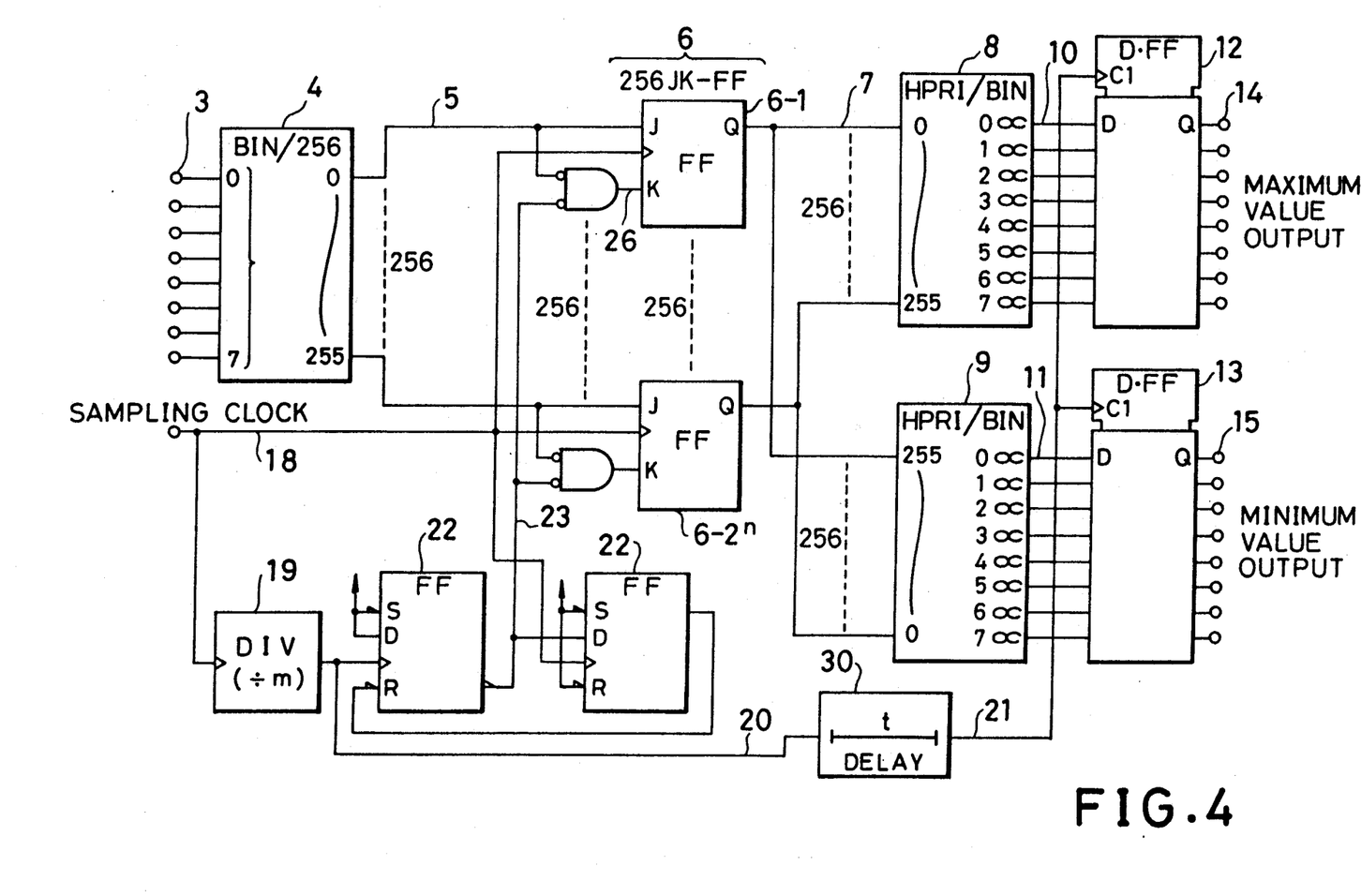
FIG. 4 is a block diagram showing the major portion of the first embodiment.
Figure 5A:
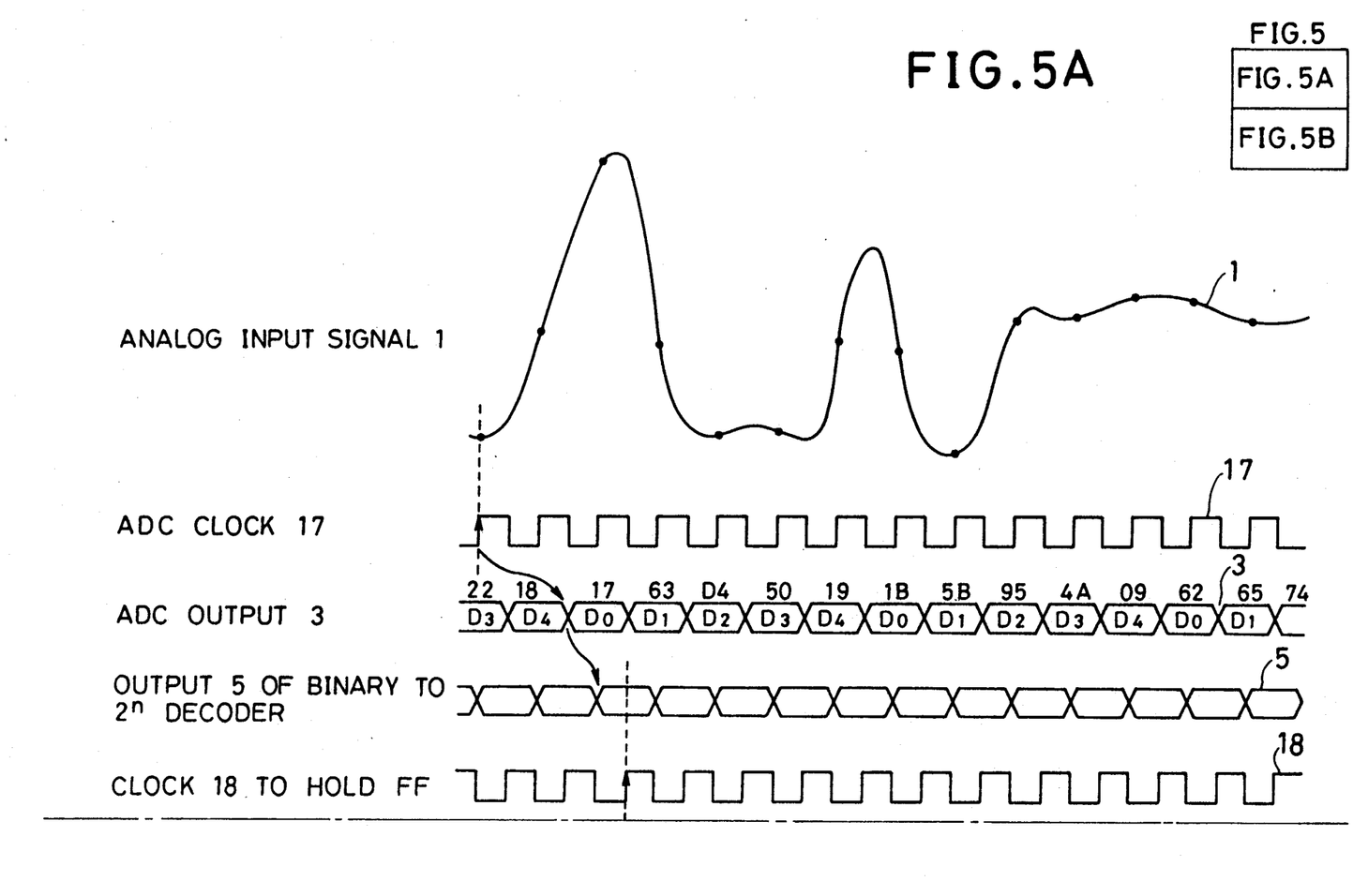
FIGS. 5A and 5B are timing diagrams illustrating the operation of the first embodiment.
Figure 5B:
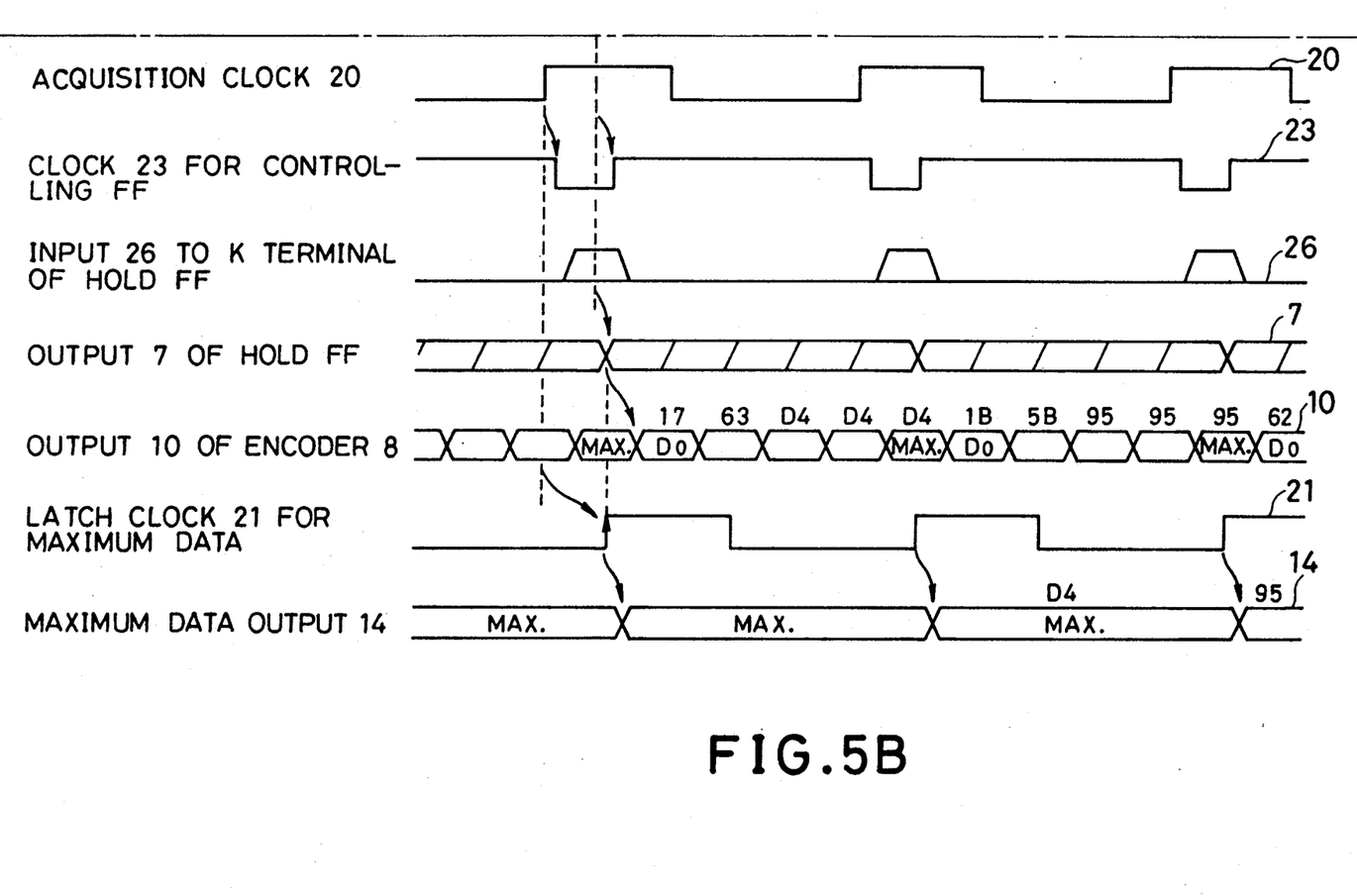

FIG. 4 is a block diagram showing a major portion of the first embodiment more specifically. In this figure, the bit number n of the output signal of the analog-to-digital converter 2 in FIG. 3 is $n=8$, and the sampling number m over an acquisition interval is $m=5$. FIGS. 5A and 5B illustrate waveforms of various portions of the circuit of the first embodiment.

Next, the operation of the embodiment will be described referring to FIGS. 3–5B.

A clock generating circuit 16 generates a sampling clock 18 whose interval is identical to the sampling interval of the analog-to-digital converter 2, and supplies the sampling clock 18 to a divider circuit 19 and a data distribution state holding circuit 6 consisting of $2^n$ flip-flops 6-1–6-$2^n$.

The divider circuit 19 divides the sampling clock 18 by integer m so as to produce acquisition clock 20 in every m sampling pulses, that is, in each acquisition interval determined in accordance with the time axis range. The acquisition clock 20 is transferred to a flip-flop controller 22, maximum value holding flip-flops 12 and minimum value holding flip-flops 13. Here, a delay circuit 30 is inserted between the divider circuit 19 and the maximum value holding flip-flops 12, and between the divider circuit 19 and the minimum value holding flip-flops 13. The delay circuit 30 is provided for compensating the transfer delay time between the data distribution state holding circuit 6 and priority encoders 8 and 9 described later.

The flip-flop controller 22 switches the data to be set into the data distribution state holding circuit 6: on the one hand, all the outputs of a decoder 4 are set; and on the other hand, one of the outputs which is selected by the decoder 4 and is of logic "1" is set as follows.

First, the analog-to-digital converter 2 converts the analog input signal 1 to n-bit digital data 3, and supplies it to the binary-to-$2^n$ decoder 4. This decoder 4, receiving an n-bit binary code, selects one of the $2^n$ signal lines in response to the input binary code. In other words, inputting the n-bit binary code to the decoder 4 will change the logic level of one of the $2^n$ output lines. The output 5 of the decoder 4 is fed to the data distribution state holding circuit 6 consisting of $2^n$ flip-flops 6-1–6-$2^n$ arranged in parallel fashion.

Each time the first digital data in every acquisition interval is produced from the analog-to-digital converter 2, that is, at the initiation of each acquisition cycle, a flip-flop controller 22 produces a signal 23 of logic "0" as seen in FIG. 5B. Consequently, each output of the decoder 4 is inverted by a NOR circuit G-k ($k=1$–$2^n$) and is applied to the K input of each flip-flop 6-k constituting the data distribution state holding circuit 6. Thus, the logic level of each output of the decoder 4 is loaded, while maintaining its logic state, into a corresponding one of the $2^n$ flip-flops of the data distribution state holding circuit 6. For example, a "0" output from the decoder 4 will change the state of the corresponding flip-flop 6-k a "0" level even if the previous state of the flip-flop is in the set state ($Q=1$). This is because the "0" output from the decoder 4 is directly applied to the J input of the flip-flop 6-k, and is simultaneously inverted to a "1" level by the NOR circuit to be applied to the K input thereof. In contrast, when the output of the decoder 4 is changed to a "1" level, the flip-flop 6-k in the reset state ($Q=0$) will change to the set state ($Q=1$) because the J and K inputs are changed to "1" and "0", respectively, at this point. Thus, the outputs of the decoder 4 corresponding to the initial digital data in each acquisition interval are set in the data distribution state holding circuit 6 in synchronism with the sampling clock 18.

Once the initial data has been set in the data distribution state holding circuit 6, the flip-flop controller 22 sets the signal 23 to logic "1" to set all the K inputs to logic "0". Thus, each flip-flop 6-k is ready to be set when level "1" is applied to the J input, and to be maintained at its previous state when level "0" is applied to the J input.

As a result, when the next data is delivered from the analog-to-digital converter 2, only the flip-flop 6-k corresponding to the selected output (i.e., the output of logic "1") is set. In this case, the previously set flip-flops are unchanged. Similar cycles are repeated until the total m data are decoded and are read into the flip-flops 6-1–6-$2^n$ of the data distribution state holding circuit 6.

On completing the loading of the m data into the flip-flops 6-1–6-$2^n$, only the flip-flops corresponding to the selected "1" level outputs have been set so that the data distribution of the successive m data is held in the circuit 6. Thus, in the flip-flops 6-1–6-$2^n$ of the data distribution state holding circuit 6, the flip-flop that is in the set state and is closest to the MSB (most significant bit: the flip-flop 6-$2^n$, for example) indicates the maximum value, and the flip-flop that is in the set state and is closest to the LSB (least significant bit: the flip-flop 6-1, for example) indicates the minimum value in the m data sequence.

A maximum value discrimination priority encoder 8 and a minimum value discrimination priority encoder 9 are used to select and output the maximum value (n-bit binary data) 10 and the minimum value (n-bit binary data) 11, respectively, on the basis of the output data 7 of the data distribution state holding circuit 6.

The maximum value 10 and the minimum value 11 in the m successive data (that is, in one acquisition interval), which are produced from the priority encoders 8 and 9, are read into maximum value holding flip-flops 12 and minimum value holding flip-flops 13 as binary data 14 and 15, respectively, by the holding signal 21 generated from the divider circuit 19 at every acquisition interval. The data 14 and 15 are transferred to the acquisition memories 24 and 25 to be stored therein, respectively. After that, the holding operation of the data distribution of the next acquisition cycle is started to repeat the above procedure.

Thus, the maximum value and the minimum value of the data produced from the analog-to-digital converter 2 are detected over each acquisition interval, and the maximum and minimum values are recorded in the memories 24 and 25.

The glitch detecting circuit of the present invention has no feedback loop, and carries out only forward operation. Accordingly, the operating speed is not limited by the total transfer delay time of the loop as stated before, but by individual transfer delay times, such as a setup time and holding time of the flip-flops for holding the distribution state, the maximum value and the minimum value, a maximum toggle frequency, and a timing skew between the control signal for the signal processing and the data.

An evaluation of an operation speed limit of a practical glitch detection circuit of the present invention is carried out as follows. It is assumed that a circuit shown in FIG. 4 is arranged by using AS-TTL elements. For example, 74AS109 flip-flops are used for the flip-flops of the data distribution state holding circuit 6, and 74AS574 flip-flops are used for the maximum and minimum value holding flip-flops 12 and 13 so that the timing skew of each circuit is restricted less than 3 nanoseconds by using a delay circuit, a synchronizing circuit, or the like.

In this case, the evaluation of the flip-flops of the data distribution state holding circuit 6 is as follows: the setup time is 5.5 nanoseconds, the holding time is 0 nanoseconds, and the timing skew is 3 nanoseconds; hence, the total of these is 8.5 nanoseconds, which presents limit of 117 MHz and a maximum toggle frequency of 105 MHz. On the other hand, in the maximum value and minimum value holding flip-flops 12 and 13, the setup time is 2 nanoseconds, the holding time is 2 nanoseconds, and the time skew is 3 nanoseconds; hence, the total of these is 7 nanoseconds, which presents a limit of 142 MHz and a maximum toggle frequency of 125 MHz. Accordingly, the upper limit of the operation frequency of the glitch detection circuit of the present invention arranged by using the AS-TTL elements is limited by the maximum toggle frequency of the flip-flops of the data distribution state holding circuit 6, and becomes 105 MHz.

The present invention is not restricted by the embodiment described above. Various modifications can be made according to applications in a manner obvious to those skilled in the art.

For example, although the analog-to-digital converter 2 in FIG. 3 is specified to produce an n-bit binary code, other codes like a BCD code can be used. In such a case, a decoder is used that can decode the input code into the number of lines equal to the number of terms of the code.

Furthermore, the memories 24 and 25 for storing the maximum value and the minimum value need not be provided separately. The outputs of both the maximum and minimum value priority encoders 8 and 9 can be alternately recorded in the same memory so that the memory is used in common to both the values.

EMBODIMENT 2

Figure 6:
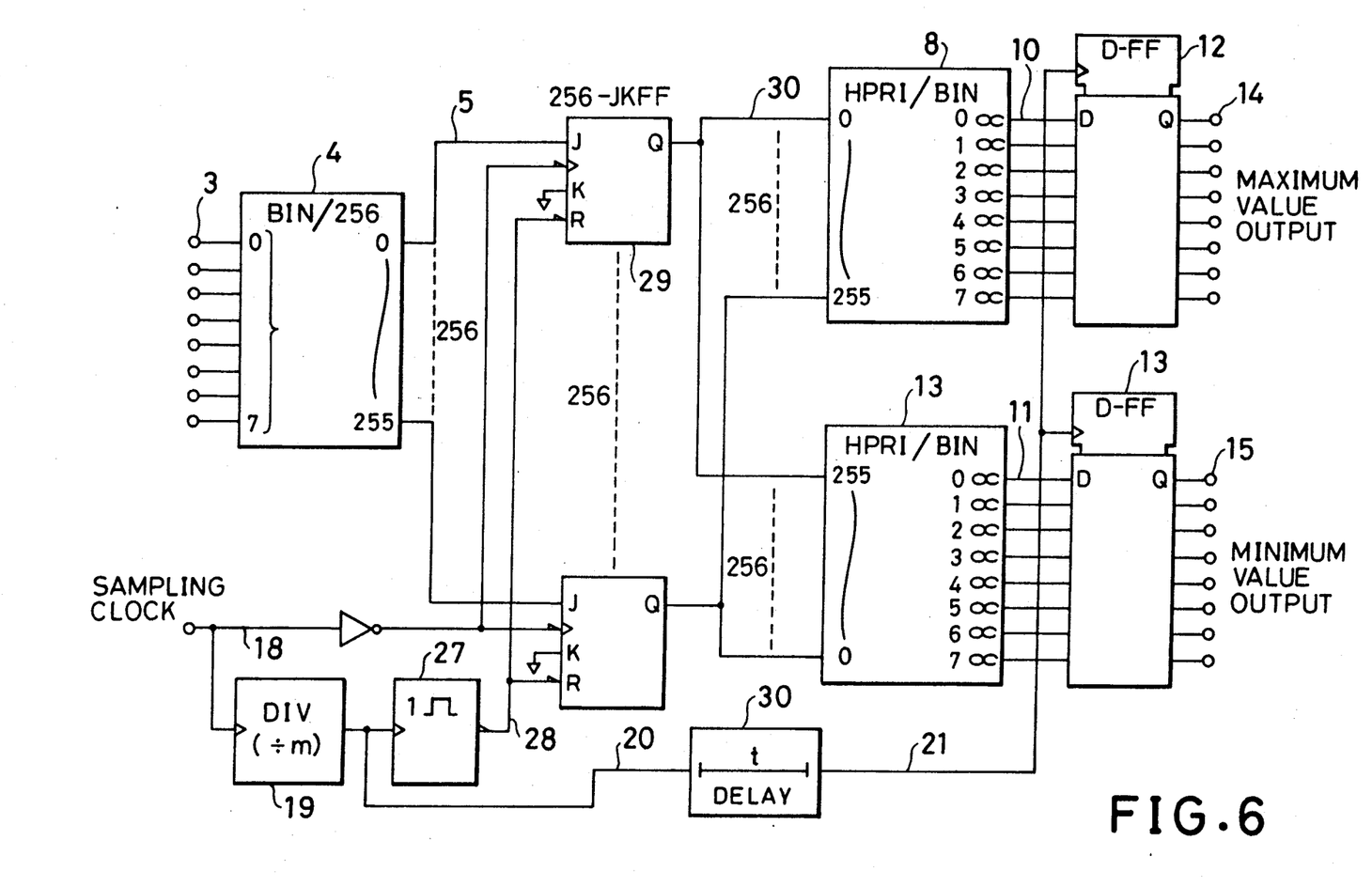
FIG. 6 is a block diagram showing an arrangement of the major portion of a second embodiment according to the present invention.
Figure 7A:
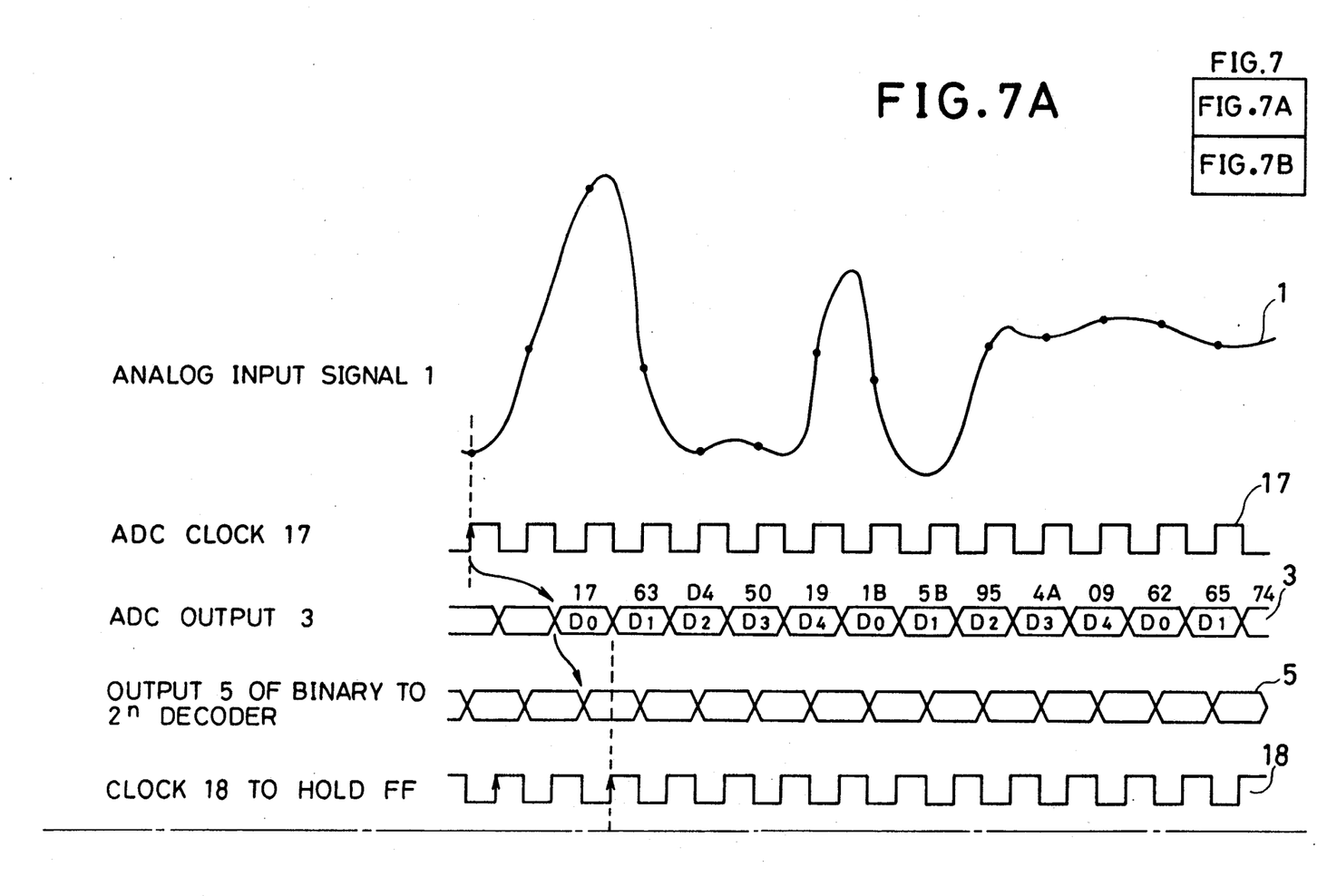
FIGS. 7A and 7B are timing diagrams illustrating the operation of the second embodiment.
Figure 7B:
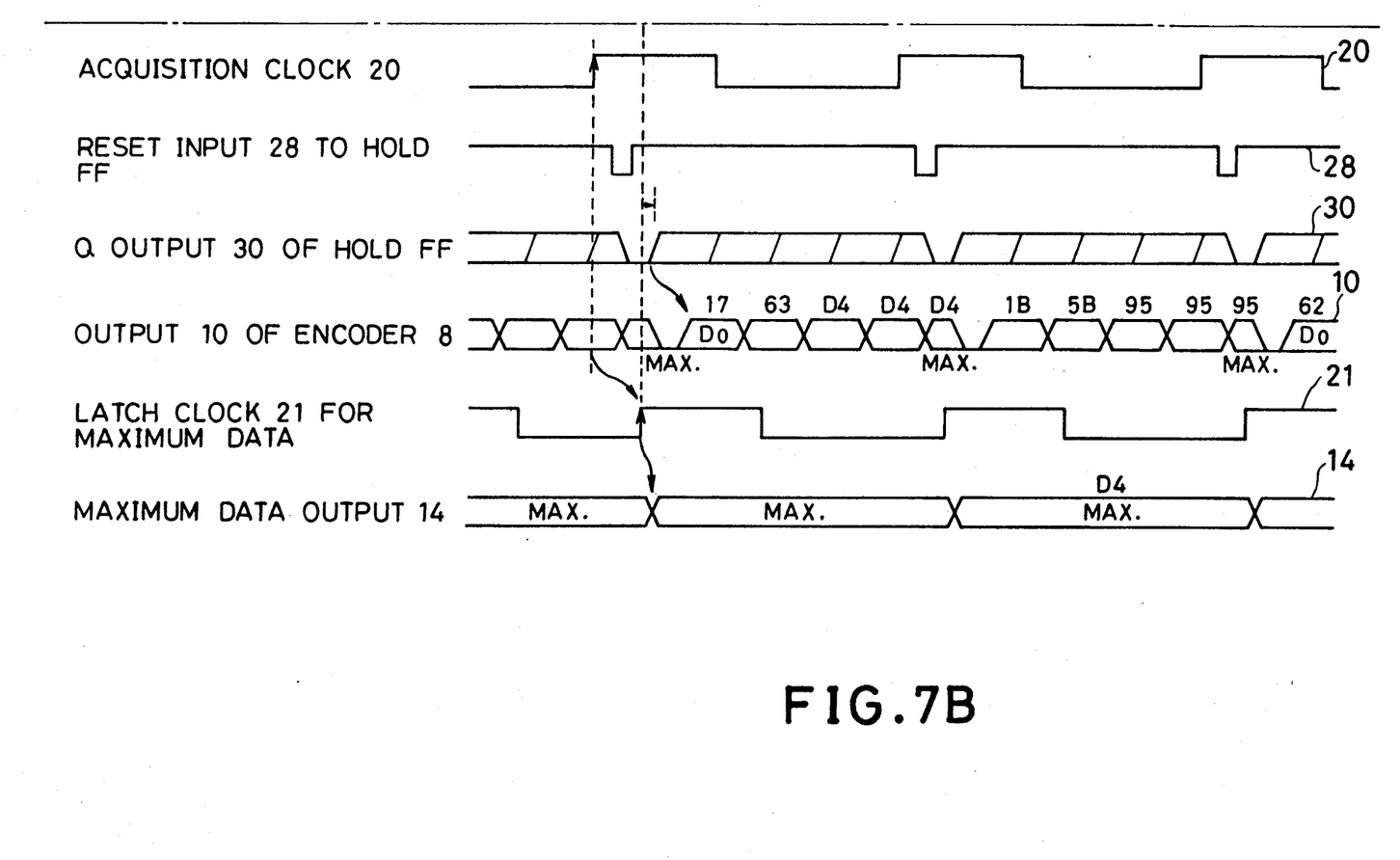

FIG. 6 is a block diagram showing an arrangement of a second embodiment of a glitch detection circuit according to the present invention, and FIGS. 7A and 7B are diagrams illustrating waveforms for explaining the operation of the second embodiment.

In the second embodiment, an acquisition clock 20 activates a monostable multivibrator 27 so as to form an output signal 28 consisting of pulses of a narrow bandwidth as shown in FIG. 7B. The output signal 28 is fed to the reset terminal of each flip-flop of a data distribution state holding circuit 29 to reset it, thereby initializing the circuit 29. After that, the glitch detection circuits operates in a manner similar to that of the first embodiment shown in FIGS. 3–5B, and so the explanation thereof will be omitted.

EMBODIMENT 3

Figure 8:
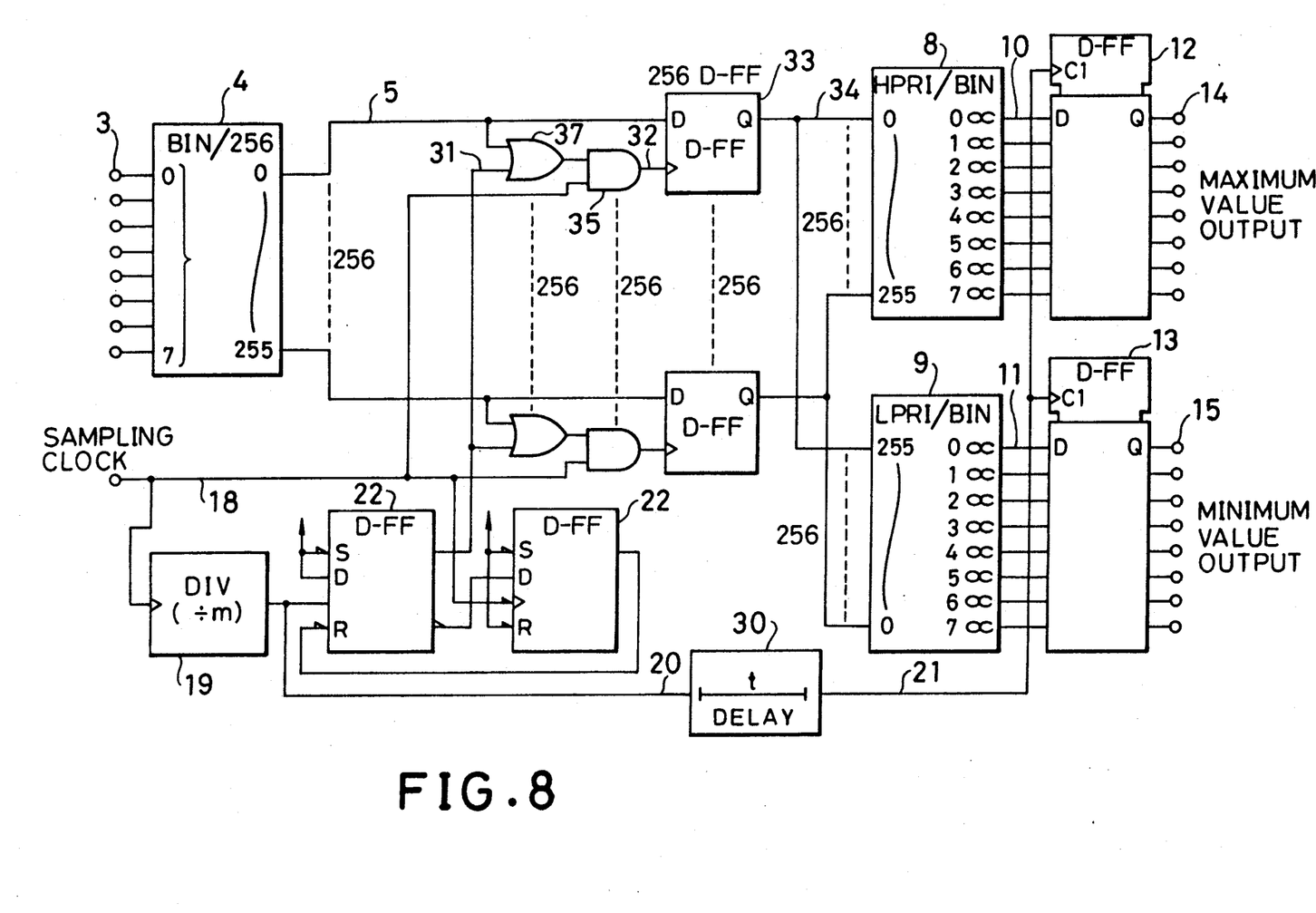
FIG. 8 is a block diagram showing an arrangement of the major portion of a third embodiment according to the present invention.
Figure 9A:
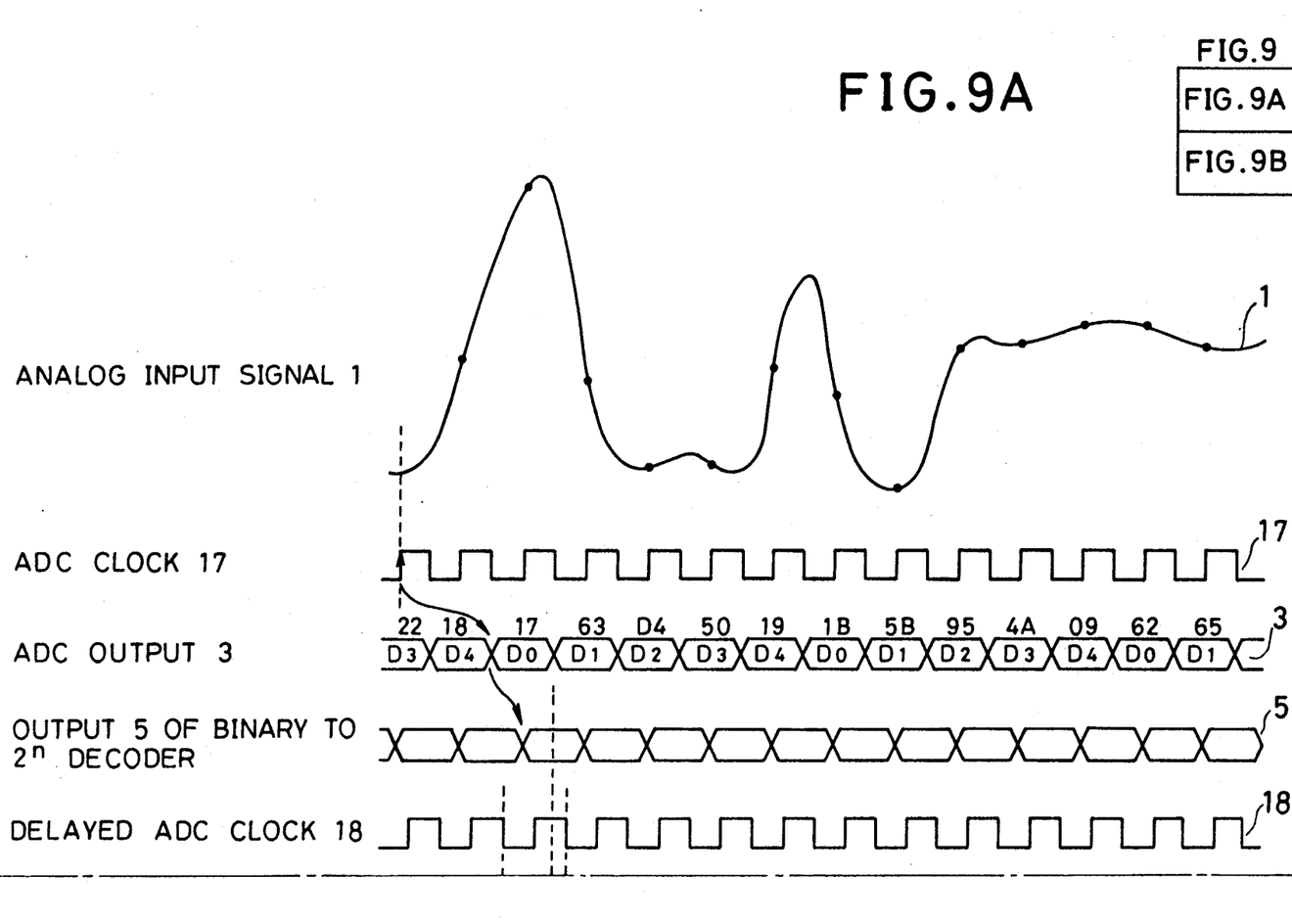
FIGS. 9A and 9B are timing diagrams illustrating the operation of the third embodiment.
Figure 9B:
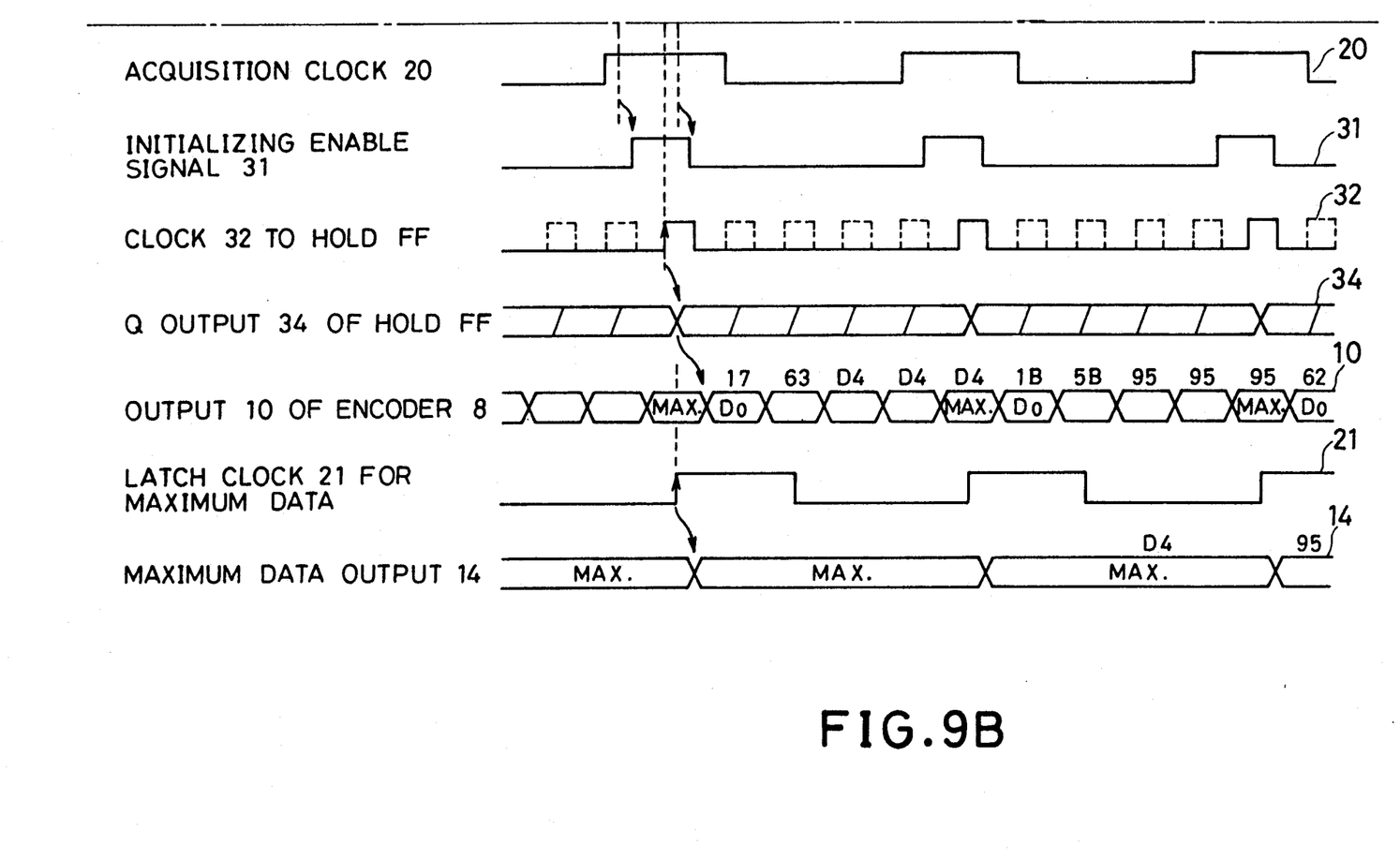

FIG. 8 is a block diagram showing an arrangement of a third embodiment of a glitch detection circuit according to the present invention, and FIGS. 9A and 9B are diagrams illustrating waveforms for explaining the operation of the third embodiment.

In this embodiment, D-type flip-flops are used as flip-flops of the data distribution state holding circuit 33. The outputs 5 of the decoder 4 are applied to the data input terminal of each D-type flip-flop, and the output (clock signal) 32 of an AND gate 35 is fed to the clock terminal of each D-type flip-flop. Here, the clock signal 32 is an AND of the output of an OR gate 37 and the sampling clock 18, and the output of the OR gate 37 is an OR of the output 5 of the decoder 4 and an initializing enable signal 31. Thus, the set and hold of the D-type flip-flops are controlled by the clock signal 32 as shown in FIG. 9B so as to achieve the operation similar to the first embodiment. Incidentally, clock pulses 32 shown by broken lines in FIG. 9B indicate that the clock pulses 32 may be present or absent according to the outputs of the decoder 4.

When the circuit of the present invention is arranged as an ASIC (Application Specific Integrated Circuit) by adopting the CMOS structure, a comparable speed while that of the AS-TTL can be obtained, with reducing the consumption power of the circuit.

Although specific embodiments of a glitch detection circuit and method constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A glitch detection circuit comprising:
   A/D converting means for sampling an input signal at predetermined sampling intervals during a predetermined acquisition interval which is longer than or equal to the sampling interval to produce digital data;
   state holding means connected to output terminals of said A/D converting means for holding a superimposed state of a distribution of each value of the input signal sampled during the predetermined acquisition interval as digital data;

discrimination means for detecting a maximum value and a minimum value of the input signal sampled during the acquisition interval by detecting the maximum value and the minimum value of the digital data held in said state holding means; and storing means for storing the maximum value and the minimum value detected by said discrimination means for each acquisition interval.

2. A glitch detection circuit comprising:

A/D converting means for sampling an input signal at predetermined sampling intervals during a predetermined acquisition interval which is longer than or equal to the sampling interval to produce digital data;

state holding means connected to output terminals of said A/D converting means for holding a distribution state of the digital data produced during the predetermined acquisition interval, said state holding means including decode means, having $2^n$ output lines, for decoding a logic state of n-bit digital data fed from said A/D converting means, to select one of said $2^n$ output lines corresponding to one of $2^n$ logic states of the n-bit digital data to represent the logic state of the n-bit digital data, and a plurality of binary value storing means, each of said binary value storing means being connected to one of the $2^n$ output lines of said decode means, for storing the logic state represented by said decode means;

discrimination means for detecting a maximum value and a minimum value of the input signal sampled during the acquisition interval based on the digital data held in said state holding means; and storing means for storing the maximum value and the minimum value detected by said discrimination means for each acquisition interval.

3. A glitch detection circuit as in claim 2, wherein said discrimination means comprises a first priority encoder connected to $2^n$ output lines of said binary value storing means for producing a maximum value of the n-bit digital data, and a second priority encoder connected to said $2^n$ output lines of said binary value storing means for producing a mimimum value of the n-bit digital data.

4. A glitch detection circuit as in claim 2, wherein said binary value storing means includes JK flip-flops.

5. A glitch detection circuit as in claim 2, wherein said binary value storing means includes D-type flip-flops.

6. A glitch detection method comprising the steps of:
(a) converting an input signal into successive n-bit digital data by sampling the input signal at predetermined sampling intervals during a predetermined acquisition interval which is longer than or equal to the sampling interval;
(b) holding a distribution state of a first set of n-bit digital data produced by said conversion of said input signal at a first sampling interval during the acquisition interval by decoding the first set of n-bit digital data into $2^n$-bit data and holding the $2^n$-bit data;

(c) changing the distribution state by decoding a next set of n-bit digital data produced by said conversion of said input signal at a next sampling interval during the acquisition interval into $2^n$-bit data, comparing the $2^n$-bit data of said next set with the $2^n$-bit data of said first set, and updating one or more bits of the held $2^n$-bit data on the basis of the comparison;
(d) repeating step (c) with a succeeding set of n-bit digital data produced by said conversion of said input signal at a succeeding sampling interval during the acquisition interval;
(e) detecting, after completing steps (a)-(d), a maximum value and a minimum value of the n-bit digital data produced by said conversion during the acquisition interval; and
(f) storing the maximum value and the minimum value of the n-bit digital data produced by said conversion during the acquisition interval.

7. A glitch detection circuit comprising:

A/D converting means for sampling an input signal at predetermined sampling intervals during a predetermined acquisition interval which is longer than or equal to the sampling interval to produce digital data;

state holding means connected to output terminals of said A/D converting means for holding a distribution state of the digital data produced during the predetermined acquisition interval, said state holding means including decode means for decoding n-bit digital data produced by said A/D converting means during said acquisition interval to select one of $2^n$ logic states of said digital data, a plurality of binary value storing means, each of said binary value storing means corresponding to a respective one of said $2^n$ logic states, and means for setting respective ones of said binary value storing means which correspond to logic states selected by said decode means;

discrimination means for detecting a maximum value and a minimum value of the input signal sampled during the acquisition interval based on the digital data held in said state holding means; and storing means for storing the maximum value and the minimum value detected by said discrimination means for each acquisition interval.

8. A glitch detection circuit as in claim 7, wherein said discrimination means comprises:

first priority encoder means, connected to said plurality of binary value storing means, for detecting the highest logic state indicated by the set binary value storing means, and for generating a maximum value of the n-bit digital data corresponding to said highest logic state; and second priority encoder means, connected to said plurality of binary value storing means, for detecting the lowest logic state indicated by the set binary value storing means, and for generating a minimum value of the n-bit digital data corresponding to said lowest logic state.

* * * * *

UNITED STATES PATENT AND TRADEMARK OFFICE
CERTIFICATE OF CORRECTION

PATENT NO. : 5,210,538
DATED : May 11, 1993
INVENTOR(S) : Masahiko Kuroiwa

It is certified that error appears in the above-indentified patent and that said Letters Patent is hereby corrected as shown below:

Claim 3, column 9, line 43, change "mimimum" to --minimum--.

Signed and Sealed this

Fifteenth Day of March, 1994

Attest:

BRUCE LEHMAN

Attesting Officer            Commissioner of Patents and Trademarks